United States Patent [19]

Kameya

[11] Patent Number: 5,030,932

[45] Date of Patent: Jul. 9, 1991

[54] ELECTROMAGNETIC DELAY LINE

[75] Inventor: Kazuo Kameya, Tsurugashima, Japan

[73] Assignee: Elmec Corporation, Tsurugashima, Japan

[21] Appl. No.: 375,413

[22] Filed: Jul. 5, 1989

[30] Foreign Application Priority Data

Jul. 7, 1988 [JP] Japan ............................ 63-169281

[51] Int. Cl.[5] ........................ H01P 9/00; H03H 7/30

[52] U.S. Cl. .................................. 333/161; 333/140

[58] Field of Search .............. 333/138, 140, 156, 139, 333/161, 162; 336/200

[56] References Cited

U.S. PATENT DOCUMENTS

| | | | |
|---|---|---|---|
| 3,670,270 | 6/1972 | Storey, II | 333/161 |
| 3,899,757 | 8/1975 | Nakagami et al. | 333/161 X |
| 4,641,113 | 2/1987 | Ozawa | 333/161 |

FOREIGN PATENT DOCUMENTS

| | | | |
|---|---|---|---|
| 2589009 | 4/1987 | France | 333/140 |
| 0199310 | 9/1986 | Japan | 333/161 |

*Primary Examiner*—Eugene R. LaRoche
*Assistant Examiner*—Seung Ham
*Attorney, Agent, or Firm*—Fish & Richardson

[57] ABSTRACT

This electromagnetic delay line is formed by disposing a ground electrode on one surface of a thin dielectric layer and serially connecting main electroconductive strips which are arranged in parallel at certain intervals on the opposite surface of the dielectric layer to form a zigzag strip to face the ground electrode and further, each main electroconductive strip itself is folded to be configured. Accordingly, the negative coupling produced in the zigzag strip is decreased and dispersed as well, thus improving the delay characteristics for the ultra-high frequency signal.

2 Claims, 3 Drawing Sheets

ELECTROMAGNETIC DELAY LINE

BACKGROUND OF THE INVENTION

The present invention relates to an electromagnetic delay line, and in particular to an improvement of such an electromagnetic delay line having an electroconductive zigzag strip disposed to face a ground electrode with a dielectric layer therebetween.

This type of an electromagnetic delay line (shown in FIG. 4) heretofore known has a structure configured by having a ground electrode 3 formed on one face (lower face in the drawing) of a dielectric layer 1 and serially connecting each of a plurality of main electroconductive strips 5 arranged in parallel at certain intervals in the longitudinal direction of this dielectric layer 1 on the other side (upper face in the drawing) of the dielectric layer 1, thereby forming a zigzag strip 7.

In FIG. 4, reference numeral 9 is a secondary electroconductive strip to connect in series the neighboring main electroconductive strips 5 to form the zigzag strip 7.

This type of an electromagnetic delay line, applying a pulse signal to the zigzag strip 7 with its one end as an input terminal, outputs the pulse signal from the other end of the zigzag strip 7 accompanying a delay time corresponding to the length of the zigzag strip 7.

Therefore, the delay time can be increased by enlarging the length of the main electroconductive strips 5 or the width W and a size in the longitudinal direction L crossing at a right angel with the width W of the zigzag strip 7.

The delay time can be also increased with an area occupied by the electromagnetic delay line unchanged by making the main electroconductive strip 5 thinner and approaching the neighboring main electroconductive strips 5 to each other to increase the number of the main electroconductive strips 5.

In the above configured electromagnetic delay line, however, as shown in FIG. 5 illustrating a sectional view taken in a plane shown by the arrows V—V in FIG. 4, the neighboring main electroconductive strips 5 have the signal flown in opposite direction, every other main electroconductive strips 5 have the signal flown in the same direction, and every two other main electroconductive strips 5 have the signal flown in opposite direction. So, positive and negative couplings are generated alternately between the neighboring main electroconductive strips 5 when seen based on any main electroconductive strip 5.

Therefore, coupling coefficients between two immediately neighboring main electroconductive strips 5 and between every two other main electroconductive strips 5 have negative values (−k1, −k3), while it has a positive value (k2) between the two main electroconductive strips 5 with another main electroconductive strip 5 therebetween.

Specifically, the negative value (−k1) between the mainly neighboring main electroconductive strips 5 comes to have a large value, giving a great influence to the delay characteristics.

Consequently, the above electromagnetic delay line has drawbacks that the negative coupling coefficient of the zigzag strip 7 tends to be great, resulting in making an output waveform have a high overshoot A as shown in FIG. 6.

Particularly, the overshoot becomes particularly great to degrade the delay characteristics when the width W is increased in the zigzag strip 7 or when main electroconductive strips 5 are made thinner and positioned to be close to increase a delay time.

SUMMARY OF THE INVENTION

The primary object of the present invention is to provide an electromagnetic delay line capable of obtaining good delay characteristics while keeping a negative coupling low between the neighboring main electroconductive strips.

It is another object of the present invention to provide an electromagnetic delay line which can easily shift a degrading frequency zone to a high frequency zone.

To accomplish the above objects, the present invention is configured by forming a ground electrode on one surface of a thin dielectric layer, forming on the other side of the dielectric layer a zigzag strip consisting of main electroconductive strips which are arranged in parallel at certain intervals and connected in series.

Then, each main electroconductive strip can be formed in the shape of a single zigzag by serially connecting the strips with the same length.

Further, each main electroconductive strip may be configured by connecting in series a plurality of zigzag electroconductive strip blocks with their zigzag directions changed at 90 degrees to each other and also, the neighboring main electroconductive strips may have their neighboring zigzag electroconductive strip blocks to be connected at 90 degrees.

In the present invention provided with the above means, among the strips extending in the width direction of the zigzag strip of each main electroconductive strip forming the zigzag strip, a negative coupling is miniaturized thanks to decrease in length of the strips opposing to each other at a narrow interval between the neighboring main electroconductive strips, while it decreases the coupling of the strips extending in the direction through the neighboring main electroconductive strips.

And, in this invention the negative coupling between the lines extending in the direction between the neighboring main electroconductive strips in each main electroconductive line mainly affects the delay line characteristics but the neighboring coupling is disposed as dispersed into small values.

DESCRIPTION OF THE PREFERRED EMBODIMENTS

The embodiments of this invention will be described in detail with reference to the attached drawings.

Figure 1:
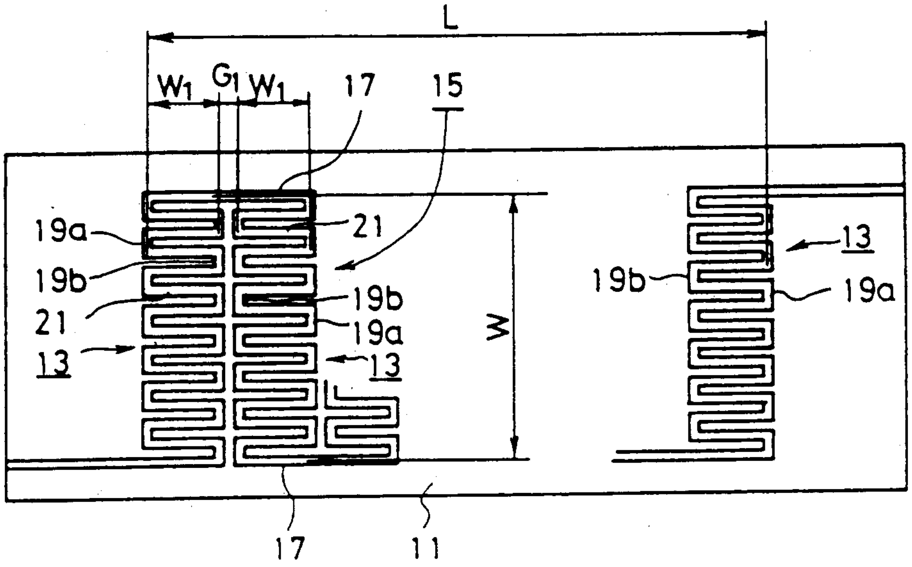
FIG. 1 is a plan view showing a first preferred embodiment of the electromagnetic delay line of the present invention.

FIG. 1 is a plan view showing the first embodiment of the electromagnetic delay line of the present invention.

Figure 4:
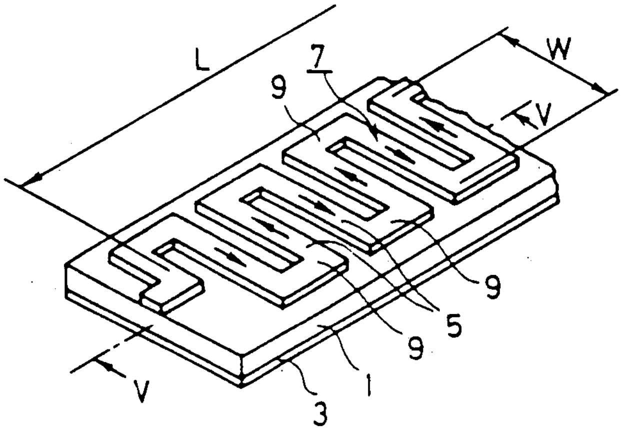
FIG. 4 (PRIOR ART)
FIG. 4 is a partial perspective view showing a conventional electromagnetic delay line.
Figure 5:
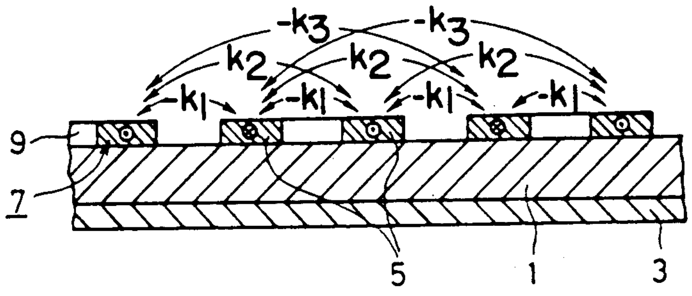
FIG. 5 (PRIOR ART)
FIG. 5 is a sectional view of the delay line, taken in a plane shown by the arrows V—V in FIG. 4.
Figure 6:
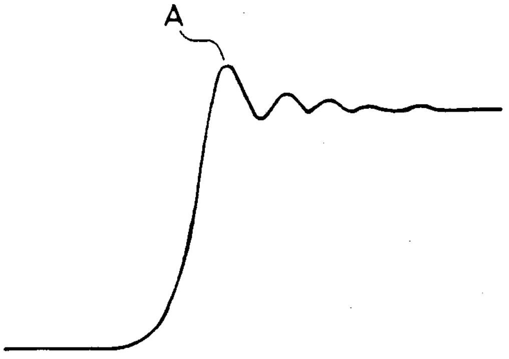
FIG. 6 (PRIOR ART)
FIG. 6 is an output waveform form produced from the electromatic delay line of FIG. 4.

In the drawing, the whole one surface (the lower surface, not shown in FIG. 1) of a thin longitudinal dielectric layer 11 is formed with a ground electrode (see the ground electrode in FIG. 4 and FIG. 5). On the other surface of the dielectric layer 11 (the upper surface in the drawing), an L-long zigzag strip 15 which is formed by serially connecting a plurality of main electroconductive strips 13 having sizes with the width W is formed to face the ground electrode through the dielectric layer 11.

In the drawing, reference numeral 17 denotes a secondary electroconductive strip which is used to serially connecting the neighboring main electroconductive strips 13 for forming the zigzag strip 15.

Each main electroconductive strip 13 of the zigzag strip 15 is formed into a shape respectively folded rectangularly in the longitudinal direction L with the width W1, and two neighboring main electroconductive strips 13 are symmetrical with an interval G1 therebetween. More specifically, each main electroconductive strip 13 is formed by serially connecting alternately strips 19*a*, 19*b* extending in the direction of width W and a strip 21 extending in the direction of the width W1.

The electromagnetic delay line thus configured, when a pulse signal is entered from one end of the zigzag strip 15, outputs a pulse signal with a time delay corresponding to the length of the zigzag strip 15 from the other end thereof.

It is noted then that in the neighboring main electroconductive strips 13, electric current flows through the strips 19*a*, 19*b* and the strip 21 alternately, resulting in producing negative or positive coupling between the neighboring main electroconductive strips 13 depending on the direction the electric current flows.

Total of their coupling values becomes negative but this value is always small without fail as compared with the case that the main electroconductive strips 15 with the width W are arranged at an interval G1 in the existing configuration as shown in FIG. 4.

On the other hand, since the main electroconductive strip 13 possesses fifteen strips 21, the length of the main electroconductive strip 13 is W+15W1, which is far longer than the length W in the existing structure.

Therefore, the negative coupling between the main electroconductive strips 13 turns out to be very small for a unit length of the main electroconductive strips 13. As a result, the effects of this negative coupling on the delay characteristics can be almost neglected.

On the other hand, in a single main electroconductive strip 13, a small negative coupling takes place among many strips 21 with length W1 and under this condition, the negative coupling is dispersed into many small values.

Then, it was found that with the negative coupling arranged as dispersed minutely, a frequency zone which has its delay characteristics degraded is shifted toward a higher frequency zone.

Consequently, the delay characteristics of the electromagnetic delay line of the present invention, even when an ultra-high speed pulse signal is passed through it, can be readily fattened sufficiently within the frequency component zone of the pulse signal, thus making it easy to output an ultra-high speed signal without overshoot.

Figure 2:
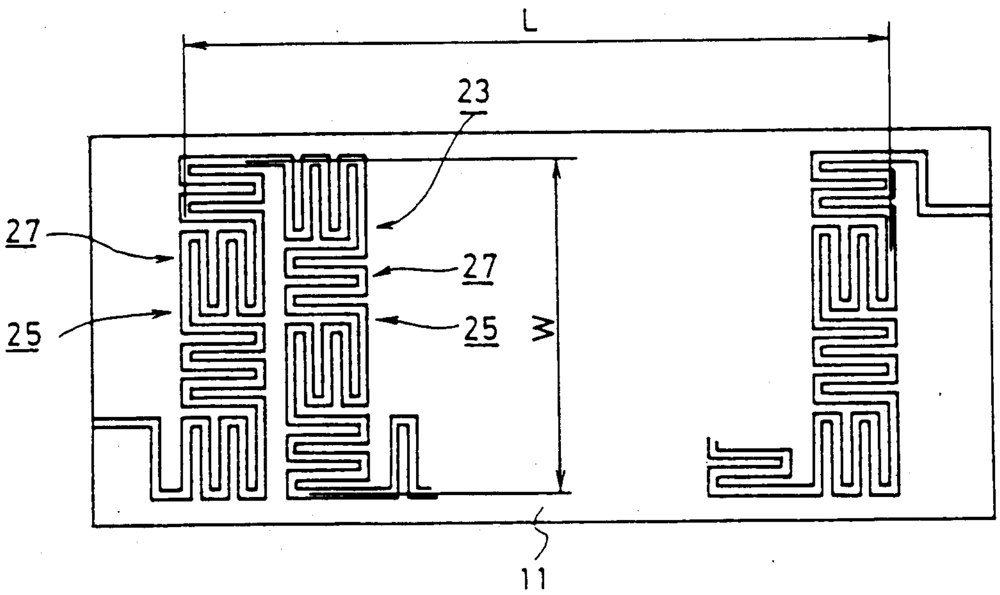
FIG. 2 is a plan view showing a second preferred embodiment of the present invention.

FIG. 2 shows the second preferred embodiment of the present invention.

Each main electroconductive strip 13 per se in the first embodiment has a single zigzag form by mainly connecting in series each strip 21 with the same length, while in the second preferred embodiment, the zigzag form of each main electroconductive strip 25 configuring the zigzag strip 23 is divided into plural numbers.

More specifically, each main conductive strips 25 is formed by connecting in series a plurality of zigzag electroconductive strip blocks 27 which are formed by being rectangularly folded, and the folding direction of the neighboring zigzag electroconductive strip blocks 27 was varied by 90 degrees respectively to cros at a right angle. Further, between the neighboring main electroconductive strips 25, the neighboring zigzag electroconductive strip blocks 27 are formed so as to mutually cross at a right angle with respect to their zigzag direction, and each of the zigzag electroconductive strip blocks 27 is parallel with the width direction W or the length direction L.

In this electromagnetic delay line with the above second configuration, the coupling between strips crossing at a right angle is zero between the neighboring zigzag electroconductive strip blocks 27 of the same and one electroconductive strip 25 and of the neighboring main electroconductive strips 25.

Therefore, for the neighboring zigzag electroconductive strip blocks 27, where long strips are formed to mutually cross at a right angle, the negative coupling affecting the delay characteristics is limited to mutually parallel strips in each zigzag electroconductive strip block 27, and the negative coupling is arranged as dispersed, thus resulting in providing flat plan delay and fast rise.

Figure 3:
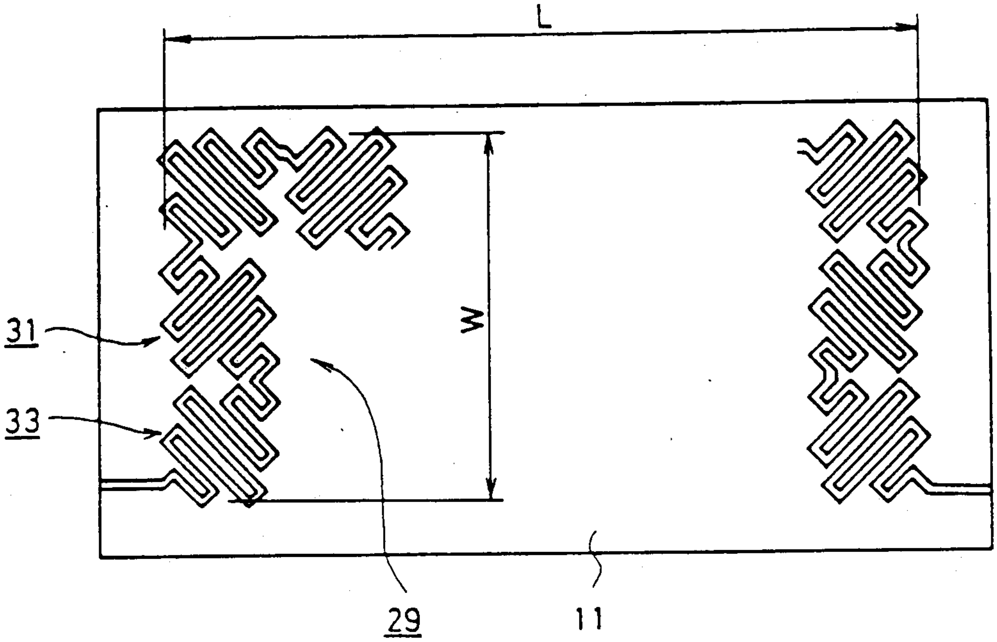
FIG. 3 is a plan view showing a third preferred embodiment of the present invention.

FIG. 3 shows the third preferred embodiment of the present invention, which is a modified embodiment of the second embodiment.

Zigzag electroconductive strip block 33 of each main electroconductive strip 31 which forms a zigzag strip 29 is formed by being folded at 45 degrees with respect to the width direction W and the length direction L.

In this third configuration, it is possible to suppress the negative coupling between the neighboring zigzag electroconductive strip blocks 27 be small. Thus, it is easy to attain the delay characteristics with the overshoot suppressed as described above.

However, in the neighborhood of the connection with the neighboring zigzag electroconductive strip blocks 33 in the main electroconductive strip 31, a short strip is folded into a zigzag form in view of the occupying area. Therefore, it is hard to increase a delay time per unit area at that connected portion.

On this point, the second embodiment provides a better space factor, making it possible to increase the delay time very much.

In the present invention, it is optional to select a zigzag form of each electroconductive strip block for forming a zigzag strip. For example, it is possible that each strips 19*a*, 19*b*, 21 of FIG. 1 is more minutely folded rectangularly.

Thus, the electromagnetic delay line of the present invention can form the ground electrode and the zigzag strip via the thin dielectric layer, and also, since the main electroconductive strip forming the zigzag strip is formed in the form of a zigzag pattern, the neighboring main electroconductive strips between which the magnetic coupling between the neighboring main electroconductive strips can be decreased small to an extent which can be neglected. Besides, since the negative coupling produced in each main electroconductive strip can be arranged as dispersed, the delay characteristics to be attained can possess fast rise characteristics with its overshoot suppressed.

And, narrowing the interval between the neighboring main electroconductive strips hardly increases the negative coupling, making it possible to miniaturize the product size while increasing the delay time.

Besides, in the configuration that the main electroconductive strip has a plurality of zigzag electroconductive strip blocks which are mutually arranged at 90 degrees in their zigzag directions and connected in series and also the zigzag directions of this neighboring zigzag electroconductive strip blocks between the neighboring main electroconductive strips are mutually changed at 90 degrees, it is possible to extensively decrease the negative coupling produced between the neighboring main electroconductive strips. Futher, where the strip direction of the zigzag electroconductive strip block is made to be parallel with the width and length of the zigzag strip, the space factor of the electroconductive strip is made satisfactory and the delay time can be increased.

What is claimed is:

1. An electromagnetic delay line comprising:

a thin dielectric layer, a ground electrode formed on one surface of the dielectric layer, and a zigzag strip formed on an other surface of the dielectric layer and having a plurality of main electroconductive strips arranged serially connected with each other so as to oppose each other mutually in parallel at certain intervals, wherein said each main electroconductive strip of the zigzag strip is folded in the form of a zigzag pattern, and wherein each said main electroconductive strip is formed by serially connecting a plurality of zigzag electroconductive strip blocks with their zigzag directions changed at 90 degrees with respect to the zigzag directions of the neighboring zigzag electroconductive strip blocks of the neighboring main electroconductive strips.

2. An electromagnetic delay line comprising:

a thin dielectric layer, a ground electrode formed on one surface of the dielectric layer, and a zigzag formed on an other surface of the dielectric layer and having a plurality of main electroconductive strips arranged serially connected with each other so as to oppose each other mutually in parallel at certain intervals, wherein said each main electroconductive strip of the zigzag strip is folded in the form of a zigzag pattern, wherein each said main electroconductive strip is formed by serially connecting a plurality of zigzag electroconductive strip blocks with their zigzag directions changed at 90 degrees with respect to the zigzag directions of the neighboring zigzag electroconductive strip blocks of the neighboring main electroconductive strips, and wherein each said zigzag electroconductive strip block is disposed at an angle of 45 degrees with respect to the longitudinal direction of said main electroconductive strip, and the zigzag pattern is formed by strip blocks shorter than other strip blocks in the neighborhood of the connection of said neighboring zigzag electroconductive strip blocks.

* * * * *